(12) United States Patent
Mullins

(10) Patent No.: US 6,375,739 B1
(45) Date of Patent: Apr. 23, 2002

(54) APPARATUS AND PROCESS FOR CRYSTAL GROWTH

(75) Inventor: John Tomlinson Mullins, Swavesey (GB)

(73) Assignee: University of Durham, Durham (GB)

( * ) Notice: Subject to any disclaimer, the term of this patent is extended or adjusted under 35 U.S.C. 154(b) by 0 days.

(21) Appl. No.: 09/485,890

(22) PCT Filed: Jul. 27, 1998

(86) PCT No.: PCT/GB98/02224

§ 371 Date: Feb. 18, 2000

§ 102(e) Date: Feb. 18, 2000

(87) PCT Pub. No.: WO99/10571

PCT Pub. Date: Mar. 4, 1999

(30) Foreign Application Priority Data

Aug. 22, 1997 (GB) .............................................. 9717726

(51) Int. Cl.[7] .............................................. C30B 23/06
(52) U.S. Cl. .................... 117/109; 117/201; 117/104; 117/105; 117/952; 117/953; 118/715
(58) Field of Search ............................ 117/109, 952, 117/953, 104, 105, 201; 118/715

(56) References Cited

U.S. PATENT DOCUMENTS

| | | | | |
|---|---|---|---|---|
| 3,619,283 A | * | 11/1971 | Carpenter et al. .......... | 117/109 |
| 4,620,963 A | | 11/1986 | Debe ........................ | 422/240 |
| 5,365,876 A | | 11/1994 | Nason et al. ................ | 117/85 |
| 5,707,446 A | | 1/1998 | Volkl et al. ................. | 117/200 |

FOREIGN PATENT DOCUMENTS

| AU | 75580 | * 5/1976 | ................. 117/109 |
|---|---|---|---|
| DE | 43 10 744 | 10/1994 | |
| JP | 08 225392 | 1/1997 | |

OTHER PUBLICATIONS

Abernathy et al., Congruent(Diffusionless) Vapor Transport, Journel of Crystal Growth vol. 47, pp. 145–154, 1979.*
Laasch et al, "CdTe crystal growth by a sublimation traveling Heater method", Journal of Crystal Growth, vol. 141, No. 1/2 Aug. 1994, pp. 81–88.
"Gravitational effects on Crystal Growth by Vapor Transport", NTIS Tech Notes, vol. 11, No. J, Nov. 1995, p. 1335.
Ishikawa, K., "Crystal growth of SbSI from the vapour phase", Journal of Crystal Growth, vol. 69, No. 2/3, 1984, pp. 399–403.
Wilke, Klaus–Thomas, Neu verf. U. hrsg. Von Joachim Bohm Unter Mitw. Von P. Gornert, Thun, Frankfurt am Main, 1988, pp. 454–458.

* cited by examiner

Primary Examiner—Robert Kunemund
(74) Attorney, Agent, or Firm—Jacobson Holman, PLLC

(57) ABSTRACT

Apparatus for bulk vapor phase crystal growth comprising: at least one source zone and at least one sink zone each associated with means for independent temperature control within the zone; and at least one passage means adapted for transport of vapor from source to sink zone; and additionally comprising means for in-situ monitoring of the sink zone; wherein means for monitoring is substantially non-intrusive in terms of temperature regulation within the sink zone; process for bulk vapor phase crystal growth employing the apparatus; method for starting up the process; method for controlling the process; use for any bulk vapor transport technique; equipment for monitoring growth using the apparatus or process; and crystal grown with the apparatus or process.

21 Claims, 8 Drawing Sheets plan flow restrictors elevation

APPARATUS AND PROCESS FOR CRYSTAL GROWTH

The present invention relates to an improved apparatus and process for crystal growth, and crystals obtained with the apparatus or process. More particularly the invention relates to an apparatus and method for vapour phase crystal growth with non-intrusive growth monitoring, crystals grown with the apparatus or process, in particular for use as a semi-conductor or optical crystals, and the use of known and novel monitoring equipment to monitor crystal growth with the apparatus or process of the invention.

In designing an effective vapour growth system which has the potential for commercial development and the production of large, high quality single crystals of semiconducting materials with for example cadmium telluride (CdTe), there are three major concerns:

1. the achievement of an adequate growth rate. Without being too specific, a rate less than 1 mm per day is becoming unacceptable. The growth rate should also be controllable as it has an important influence on crystal quality and too high a growth rate results in poor quality crystals;
2. the need to achieve high quality single crystal over a 50 mm diameter boule; and
3. the requirement for a user friendly, robust, manufacturable but flexible design.

Until fairly recently conventional vapour transport has involved the use of a simple linear system with a source and sink of single crystals of II–VI compounds, such as CdS, ZnS, which sublime easily from the solid phase. These together with a seed crystal are located in a sealed quartz ampoule in a tubular furnace in an arrangement for example as described in W. W. Piper and S. J. Polich, J. Appl. Phys. 32 (1961) 1278 (see FIG. 1 below). The source and sink are at different temperatures and therefore have different equilibrium vapour pressures. This vapour pressure difference provides the driving force for growth.

This approach results in certain fundamental problem for growth of crystals such as CdTe:

The equilibrium vapour composition of CdTe is non-stoichiometric except at one temperature, the congruent evaporation temperature which is described in more detail in D. de Nobel Philips Res. Repts. 14 (1959) 361. Due to the law of mass action:

$$[Cd][Te_2]^{1/2}=K(T) \quad (1)$$

where $[Cd]$ and $[Te_2]$ are the concentrations of cadmium and tellurium vapour respectively and K is a constant depending on temperature, T. N. Yellin and S. Szapiro, J. Crystal Growth 69 (1984) 555 have reported that minute deviations from stoichiometry in the bulk source material result in large variations in the composition of the vapour making the transport and hence growth highly non-reproducible. Furthermore, this effect gives rise to non-stoichiometry in the growing crystal which has a detrimental effect on its useful properties.

Attempting to overcome these problems with the use of high source/sink temperatures is very difficult and does not lead to a significant improvement in growth rate. Alternatively, control of the axial temperature gradient is also difficult in simple tubular systems and it is difficult to thermally isolate source and sink regions as radiation is an important thermal flux. Furthermore, exact determination of the parameters controlling growth (i.e. surface temperatures of source and seed, vapour pressures) is difficult.

This approach may be improved by the use of a reservoir containing one of the constituent elements to control the partial pressures according to equation (1). A limitation with this approach in a typical growth system is that the exact conditions of temperature and partial pressure are not determined directly and so the optimum reservoir temperature may be uncertain requiring analysis of grown crystals. This problem is compounded, in a system without in-situ monitoring, by any change in conditions during a growth run and run to run variations.

Another major advance in overcoming the limitations of this technology was proposed by the NASA/University of Alabama group of Rosenberger, Banish and Duval (RBD) in F. Rosenberger, M. Banish and W. M. B. Duval, NASA Technical Memorandum103786. Their design was a tubular system with a flow restrictor between source and seed continuously pumped via a second flow restrictor immediately downstream of the seed crystal (FIG. 2.). The continuous pumping in conjunction with a suitable sizing of the downstream flow restrictor removed a small proportion of the source material and in particular any excess component preferentially thus maintaining the vapour phase nearer stoichiometry. The first flow restrictor acted to make the mass transport rate relatively insensitive to the temperatures of the source and sink and their difference. If not restricted in this way, in a system operating under near stoichiometric conditions, appropriate transport rates would require the temperature difference between source and sink to be controlled to within a small fraction of a degree which is difficult especially if the temperatures of the source and growing surfaces cannot be measured directly. This system does, however, suffer from some significant limitations:

1. Thermal coupling along the axis of the furnace prevented the desired axial temperature profile from being obtained.
2. Direct determination of the surface temperatures of source and seed was not possible, and indirect determination uncertain due to the complexity of the radiation field.
3. The partial pressures of source species over source and seed were not directly measurable and uncertainties in the flow modelling of the system and its restrictors made indirect determination uncertain.
4. The quartz ware was complex, not easy to use and vulnerable in application.

In-situ optical monitoring is known and routinely employed in other methods for crystal growth, such as low temperature and thin film growth, where the 'efficiency' of the process is not very important. Examples of this are Molecular Beam Epitaxy (MBE) (see FIG. 3) and Metal-Organic Vapour Phase Epitaxy (MOVPE) (see FIG. 4) however these techniques are not suitable for 'bulk' crystal growth which requires enclosed transport passages for efficient source utilisation and also requires heating of the quartz passages to allow optical access while preventing condensation prior to the growth region.

Accordingly there is a need for an effective vapour growth system which allows the production of large, high quality single crystals as semi-conducting materials with effective temperature and stoichiometry control.

We have now surprisingly found that an apparatus and method for vapour phase crystal growth may be provided which enables in-situ monitoring in non-intrusive manner and moreover allows for substantial thermal isolation of source and sink regions.

In its broadest aspect there is provided according to the present invention an apparatus for bulk vapour phase crystal growth comprising:

at least one source zone and at least one sink zone each associated with means for independent temperature control within the zone; and at least one passage means adapted for transport of vapour from source to sink zone; and additionally comprising means for in-situ monitoring of the sink zone;

wherein means for monitoring is substantially non-intrusive in terms of temperature regulation within the sink zone.

Means for independent temperature control are for establishing a temperature differential to enable solid-vapour-solid phase transition in the respective source, transport and sink zones. Temperature control may therefore be selected according to the phase transitions for any given crystal which it is desired to grow, for example in the range from −150° C. to +2000° C., employing in each case a greater source than sink temperature with use of appropriate cooling and/or heating control.

Preferably means for in-situ monitoring of crystal growth comprises means providing visual and/or radiation access to the growth zone but located remote therefrom. More preferably means for direct monitoring of crystal growth comprises at least one passage for monitoring communication between the remote visual/radiation access means and the sink zone, wherein the at least one passage for monitoring communication and the at least one passage for transport of vapour associated with any given sink zone are coincident for at least that portion of their length proximal to the sink zone.

It is a particular advantage of the invention that the apparatus as hereinbefore defined may be operated with use of conventional or modified visual/radiation monitoring means, located external to the passages as hereinbefore defined, by means of the visual/radiation access means, for example x-ray and the like may be employed to monitor crystal growth. Moreover the apparatus of the invention may be employed in any bulk vapour transport technique with associated advantages in crystal quality, thereby overcoming disruption of growth conditions which are inherent with known in-situ monitoring means proximal to the sink zone.

Reference herein to locations remote from the at least one sink zone is to locations at which the presence of access means as hereinbefore defined introducing temperature variation or gradient in the vapour transport passage would substantially not disrupt the conditions of temperature required for uniform growth, having regard to conditions of temperature created by means of temperature controlling means for the at least one sink zone. In contrast reference herein to locations proximal to the at least one sink zone are to locations which would be subject to substantial disruption of conditions of temperature under these circumstances.

In a preferred embodiment the present invention provides an apparatus as hereinbefore defined wherein at least one of the passage for visual/radial communication and the passage for vapour transport associated with any given sink zone deviates by an angle of at least 5° at any one or more points along the length thereof remote from the growth zone, preferably 5°–270°, more preferably 30°–180°, most preferably 45°–110°, for example 60°–95°.

Accordingly the passage for vapour transport may deviate by an angle as hereinbefore defined whereby means for visual/radiation access may be located in the wall of the passage for vapour transport in direct line communication with the sink zone. For example means for visual/radiation access may comprise a visual/radiation-transparent port sealed into and optionally continuous with the wall of the transport passage, located opposing to the sink surface.

Alternatively the configuration of respective passages for visual/radiation access and vapour transport as hereinbefore defined may be reversed, whereby the passage for visual/radiation monitoring may deviate by an angle as hereinbefore defined from a direct line communication of source and sink zone. In this case means for visual/radiation reflection is suitably provided in association with the passage for visual/radiation monitoring at its point of deviation, whereby virtual or reflected direct line access is provided with the sink zone. For example a reflective or transmissive means such as mirrored or prism quartz may be provided in association with the visual/radiation monitoring passage at its point of deviation.

It will be appreciated that the present invention in its preferred embodiment as hereinbefore defined provides a simple and efficient means to achieve the desired vapour phase crystal growth overcoming the hereinbefore defined problems in admirable manner. It is a particular feature of the invention that the provision of passages for visual/radiation access and vapour transport which are substantially coincident proximal to any given sink zone enables non-intrusive monitoring as hereinbefore defined.

Preferably the apparatus as hereinbefore defined comprises at least one passage for vapour transport as hereinbefore defined, which deviates by an angle of at least 5° as hereinbefore defined along the length thereof between source and sink zones, more preferably deviates by at least 5° at two points along the length thereof whereby both zones are adapted to comprise source and sink material free from constraints of gravity, i.e. which are substantially provided on suitable support means and with passage means extending substantially upwardly therefrom, thereby providing for optimal transport with minimum disruption of the growth process.

The apparatus as hereinbefore defined may comprise a plurality of source zones, for example each associated with a passage for vapour transport, which passages may converge or otherwise, thereby having a common or separate passageways proximal to a single sink zone. By this means, a plurality of source zones may be located radially about a common sink zone, or extending outwardly to one side thereof or may be located in suitable pressure or temperature communication with separate sink zones. A plurality of source zones may be independently activated by means of independent temperature control means associated with each source zone, whereby vapour may be generated sequentially or simultaneously from respective source zones. In a preferred embodiment a plurality of source zones may be adapted to contain a combination of different elemental or compound source material providing each element or compound respectively of a binary, ternary or other multinary compound, connected to a single or plural growth zones via flow restrictors. Similarly a plurality of sink zones may be provided adapted to contain a plurality of seed crystals which may be the same or different, each associated with a passageway for visual/radiation and transport proximal thereto, each sink zone having dedicated means for visual/radiation access.

The apparatus of the invention may additionally comprise means for visual/radiation access to the one or more source zones, provided in similar remote manner as hereinbefore defined for access means to the sink zone, preferably such that a passage for visual/radiation access to, and passage for vapour transport from, any one source zone are common proximal to the source zone.

It is a particular advantage of the apparatus of the present invention that both objects of accurate temperature control of source and sink zones and non-intrusive monitoring of at least the sink zones can be achieved in mutually beneficial manner, whereby positioning of monitoring access means between dedicated temperature control means prevents disruption proximal to either zone.

It is a further advantage of the invention that the apparatus is ideally suited to inclusion of a flow restrictor, for example as proposed by NASA/University of Alabama RBD group above, located remote from both zones, for example upstream of sink monitoring means, for the purpose of vapour pressure control. Preferably in-situ means for monitoring vapour pressure is provided associated with a flow restrictor, in the form of known vapour pressure monitoring apparatus, for example as described in J. Carles, J. T. Mullins and A. W. Brinkman, J. Crystal Growth, 174 (1997) 740, the contents of which are incorporated herein by reference.

Flow restrictors may be selected from any known restrictors and preferably comprises a capillary, porous sintered disc or the like.

The apparatus of the invention is suitably constructed of any material which is adapted for use at the temperatures envisaged for crystal growth, for example is constructed of low, ambient or high temperature resistant material. Suitable materials are known in the art and preference is given to metal oxides, and in particular quartz, refractory oxides and graphite having the required mechanical strength and integrity, for example being reinforced with a suitable material providing mechanical strength and integrity. These materials are also preferred for reason of their high purity with low risk of contamination of crystal. Preferably the apparatus comprises a sealed or sealable structure or envelope including zones and passages as hereinbefore defined. The apparatus is suitably operated at reduced pressure and is encased in a vacuum jacket or the like.

The apparatus of the invention may be used for any bulk vapour transport techniques as hereinbefore defined. It is a particular advantage that the apparatus is adapted for growth of crystals from polycrystalline binary, ternary or other multinary compounds. It is a further advantage that the apparatus of the invention is suited for use with growth of crystal from binary, ternary or other multinary compounds requiring stoichiometry control to compensate for a degree of non-stoichiometry in vapour composition of the desired crystal.

The source and sink zones are adapted to comprise source material and seed crystal as known in the art, for example in the form of one or more reservoirs of source material and a crystal of seed material. Preferably the one or more reservoirs of source material comprise material in solid phase supported on a glass or other suitable surface or pedestal adapted to the processing conditions to be employed, allowing convenient and efficient vaporisation.

In a further aspect of the invention there is provided a process for bulk vapour phase crystal growth comprising:

providing at least one reservoir of source material and at least one sink or seed crystal, each associated with independent temperature control means; and transporting vapour phase material between source and sink or seed; and providing in-situ means for monitoring growth of crystal at each sink or seed;

wherein means for monitoring is substantially non-intrusive in terms of temperature conditions at the sink or seed.

Preferably means for monitoring radiation and transport for any given sink or seed is by coincident monitoring and transport path for at least the portion of the respective paths proximal to the sink or seed, as hereinbefore defined.

Preferably the process is operated at reduced, ambient or elevated temperature as hereinbefore defined. The process is moreover operated at reduced pressure, for example in the range up to 1 bar, preferably 0.01 to 100 mbar reduced pressure.

The process may be started up by known means to establish a sufficient vapour pressure above source material to initiate growth.

In a further aspect of the invention there is therefore provided method for starting up the process as hereinbefore defined in manner to establish a sufficient vapour pressure above the source material to initiate transport.

In a further aspect of the invention there is therefore provided a method for starting up the process as hereinbefore defined in manner to establish transport control and temperature control in the sink zone for controlled growth at the sink or seed.

The method for starting up is suitably operated with temperature and transport rate ramping profiles. It is a particular advantage that independent temperature control means provided with the apparatus of the invention enables temperature ramping specific to growth at the sink or seed, which may also be at a temperature lower than that at the source. It is thought that this gives rise to excellent crystal quality and may even prevent an amount of precipitation or eliminate precipitation entirely.

The process is suitably operated with means for in-situ monitoring as hereinbefore defined according to known techniques. Preferably temperature is monitored by known means at the surface of the sink, and optionally of the source, in manner to enable adjustment as required for optimum temperature control and stoichiometry. Likewise vapour pressure is suitably monitored between zones, for example at the location of a flow restrictor and may be adapted or adjusted as required for optimum growth.

Preferably the process of the invention as hereinbefore defined additionally comprises direct reading of process variables, comparison with optimum values of process variables for a desired crystal growth, for example, with use of a process model, and on line optimisation thereof.

The apparatus and process of the invention as hereinbefore described are adapted for growth of any crystal employing bulk vapour transport techniques.

In a further aspect of the invention is therefore provided a crystal grown with the apparatus or process of the invention. The invention is suited for growth of crystals comprising any compounds which are capable of being sublimed, having a significant vapour pressure below their melting point. Preferably crystals are selected from compounds of groups IIA, IIB, III, V, VI and VII, or Group IV, more preferably of group II and V or Group IV of the Periodic Table of the Elements, for example selected from Be, Mg, Zn, Cd, Hg, S, Se, Te and I or from Si and C. Particularly useful crystals grown with the apparatus and process of the invention cadmium telluride and silicon carbide.

In a further aspect of the invention there is provided the use of known monitoring equipment to monitor crystal growth with the apparatus and process of the invention.

In a further aspect of the invention there is provided the use of the apparatus or process of the invention for any vapour transport technique, such as semiconductor or optical crystal growth.

BRIEF DESCRIPTION OF DRAWINGS

The invention is now illustrated in nonlimiting manner with reference to the following figures wherein:

FIGS. 1a, 1b and FIG. 2 are illustrative of prior art bulk vapour phase crystal growth apparatus;

DETAIL DESCRIPTION

Figures 1, 1A:
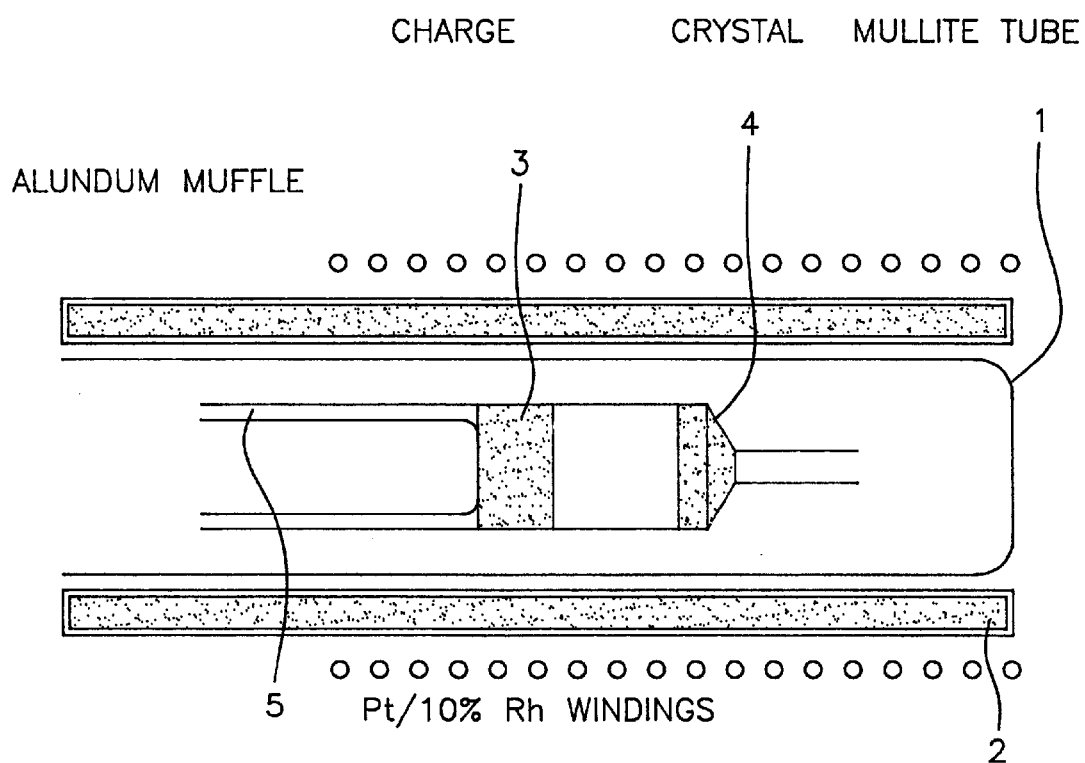

In FIG. 1 is shown a simple linear system for vapour phase crystal growth comprising a sealed quartz ampoule (mullite tube 1) in a tubular furnace with Pt/10% Rh windings and alundum muffle (2) having a source (charge 3) and sink (crystal 4) for growth of cadmium sulphide, comprised in a growing crucible (5). The source and sink (3 and 4) are not thermally isolated. Moreover there is no means for in-situ monitoring of temperature or vapour pressure.

Figure 2A:
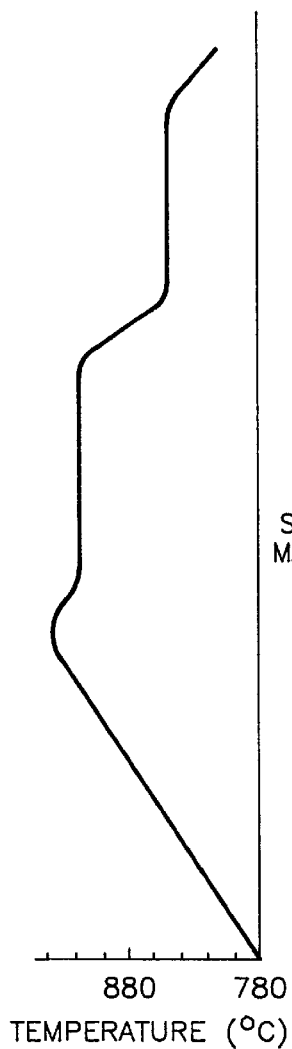
Figure 2:
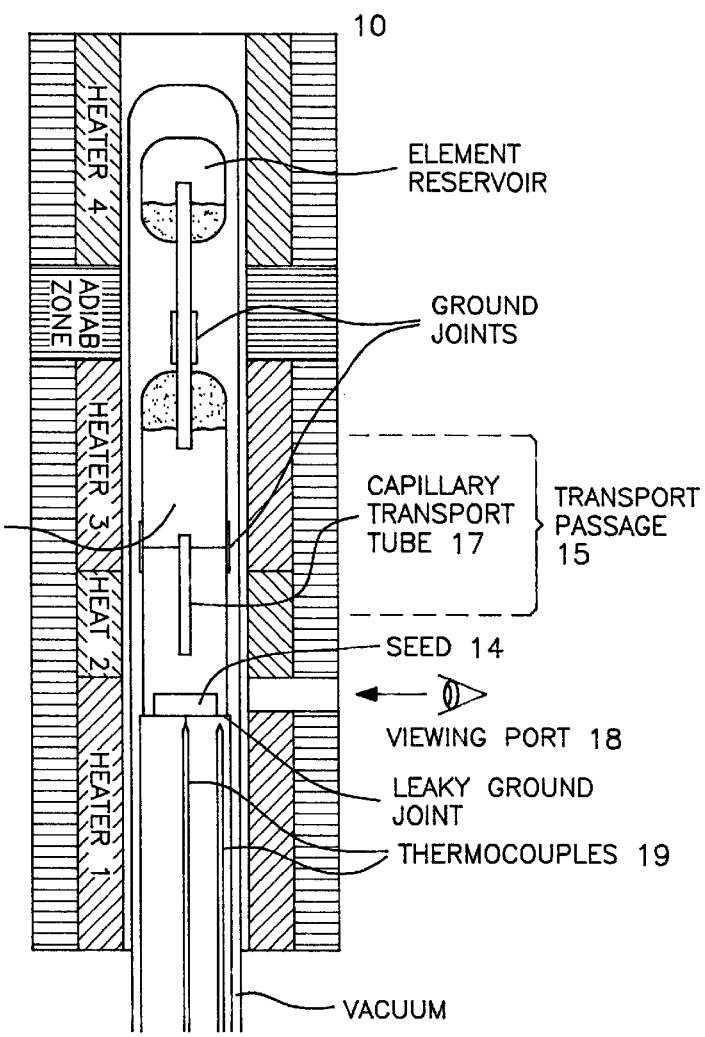

In FIG. 2 is illustrated vapour phase crystal growth apparatus comprising a tubular system with a flow restrictor as designed by RBD group University of Alabama. The apparatus comprises a pressure vessel (10), independent heaters (11–13) for respective sink, transport passage and source zones (14–16) having a capillary transport tube (17) as flow restrictor therebetween. A viewing port (18) located adjacent to the sink zone (14) provides optical access to the growing crystal in the sink zone (14). In the temperature profile shown in FIG. 2a it is clear that relatively stable temperatures are achieved in each zone as a result of the thermal isolation, however a slight irregularity is apparent at the level of viewing port (18) adjacent to the sink zones, which results from a break in the cladding in order to provide the viewing access adjacent the crystal. The temperature profile shows a staged variation reaching a maximum at flow restrictor (17) with graduated temperature decrease across the sink zone (14).

Figure 3:
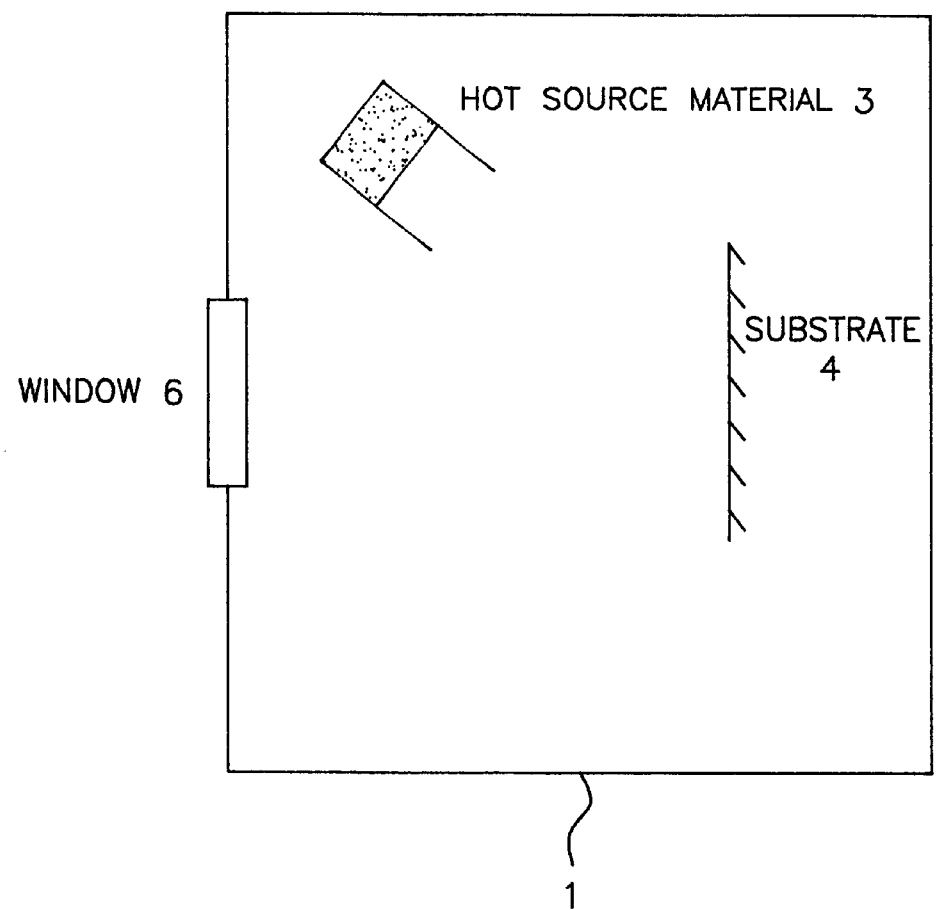
FIG. 3 and FIG. 4 are illustrative of prior art MBE and MOVPE apparatus.

In FIG. 3 is shown a prior art MBE apparatus as hereinbefore described comprising (cold) vacuum chamber (1) having a temperature controlled (hot) source (3) and a temperature controlled sink (substrate 4). In-situ monitoring means are provided (window, 6) located opposite to the sink (4). Efficient source utilisation is not a concern in this process, and much of the source material sticks to the cold vacuum chamber wall.

Figure 4:
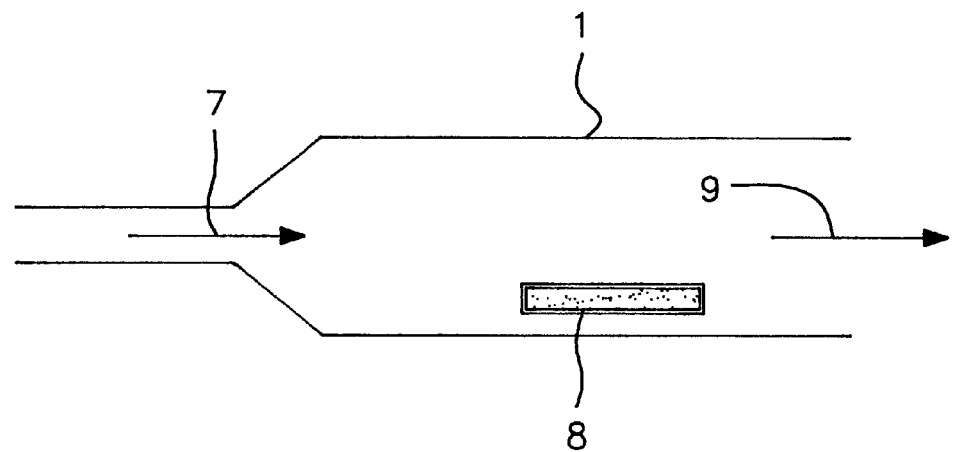

In FIG. 4 is shown a prior art MOVPE apparatus comprising a quartz envelope (1) having at one end an inlet for a metal organic source in carrier gas (7) and comprising a heated substrate (8) on to which the metal organics pyrolyse. Exhaust gases exit via outlet (9). Optical access via the quartz envelope (1) allows for in-situ monitoring of the growing crystal and vapour phase conditions. However, this technique is not suitable for the growth of 'bulk' crystals as the growth rates are limited and the requisite precursor metal organics are extremely expensive, especially as is in general the case, much is lost to the exhaust.

Figure 5:
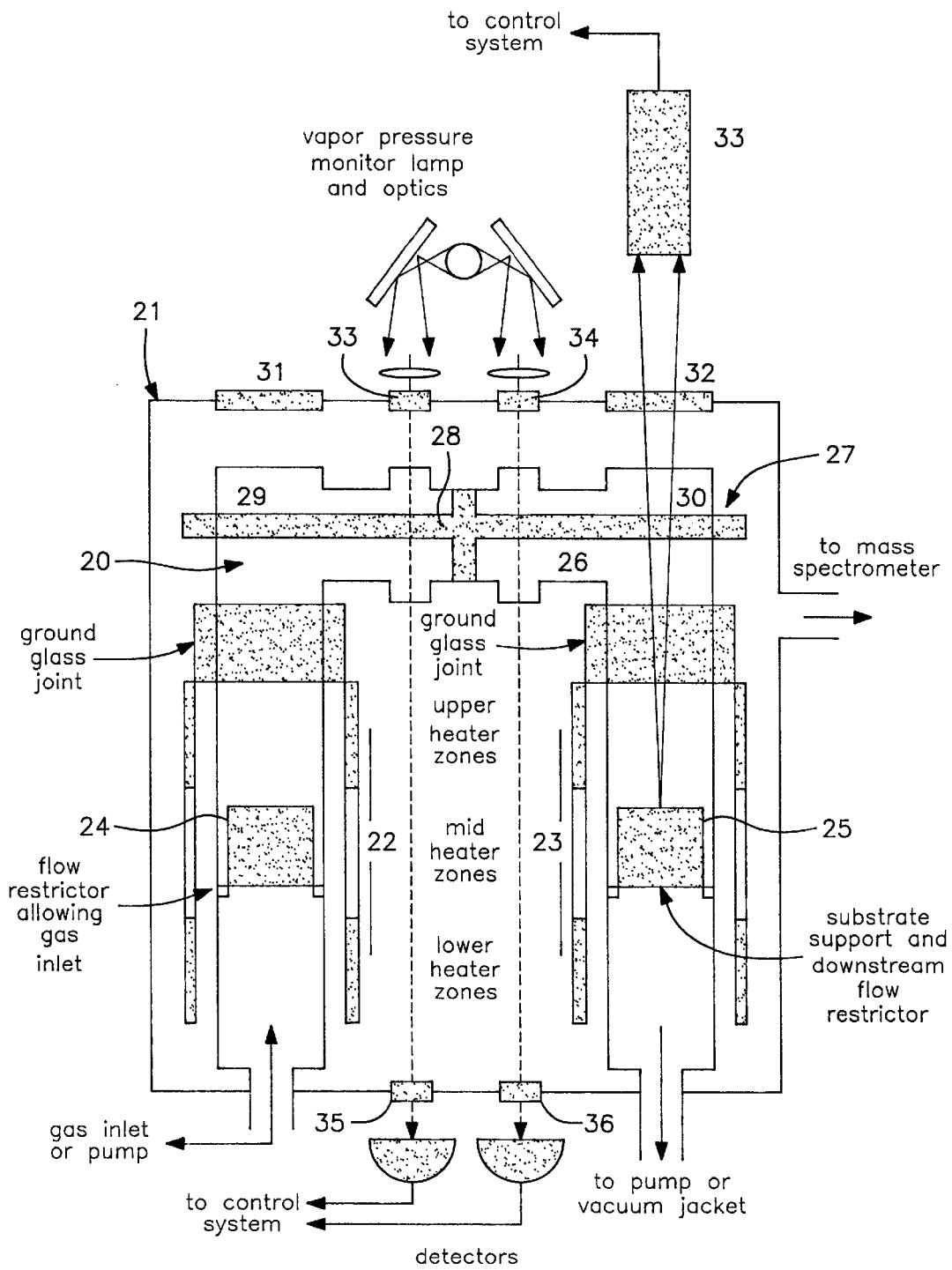
FIG. 5 and FIG. 6 are diagrammatic schemes or apparatus of the invention.

In FIG. 5 is shown the apparatus of the invention in a preferred embodiment adapted for elevated temperature bulk vapour phase crystal growth as hereinbefore defined. The apparatus comprises an evacuated U-tube in the form of a quartz envelope (20) encased in a vacuum jacket (21). Two separate three zone vertical tubular furnaces are provided (22 and 23) for the source zone (crucible, 24) and the sink zone (growing crystal 25) respectively. The source and sink zones are connected by passage means (26) for vapour transport comprising an optically heated horizontal crossmember (heating lamp, 27). Flow restrictor (28) is provided in passage (26). The passage for vapour transport comprises two separate points of deviation in each case at an angle of 90° providing respective junctions between diverging passages for in-situ monitoring and vapour transport from source zones (29), and to sink zone (30). Access means are provided (31 and 32) comprising windows allowing optical access to source and sink respectively. In the apparatus as shown in-situ means for monitoring of temperature of the surface of growing crystal in the sink zone (25) are provided in the form of a pyrometer or other optical diagnostic apparatus (33) located external to the vacuum jacket and in optical. Communication with the surface of the growing crystal. The diagnostic apparatus is in communication with a suitable control system to vary the sink zone temperature. The apparatus comprises additionally means for in-situ monitoring of vapour pressure by further access ports (33 to 36) in the region of the flow restrictor (28), through which vapour pressure monitoring lamps and optics may be directed from a position external to the vacuum jacket with detectors located as shown at a location (35 and 36) diametrically opposed with respect to the passage for vapour transport (26). These are suitably linked to a control system providing for process control.

The source tube, growth tube and crossmember, in which transport takes place, are fabricated from quartz and the system is demountable with ground glass joints between the crossmember and the two vertical tubes allowing removal of grown crystals and replenishment of source material. Radiation shields (not shown for clarity) together with the vacuum jacket which surrounds the entire system provide thermal insulation. A flow restrictor (either a capillary or a sintered quartz disc) is located in the centre of the crossmember. Growth takes place on a substrate located on a quartz block in the growth tube with the gap between this glass block and the quartz envelope forming the downstream flow restrictor. Provision is made for a gas inlet to the source tube and the growth tube may be pumped by a separate pumping system or by connection to the vacuum jacket via a cool dump tube. This system provides the following solutions to the difficulties inherent in previous designs as outlined above.

1. Source and growth regions are thermally decoupled making the achievement of optimum axial and radial temperature profiles in the growth region more tractable.
2. It is possible to observe both the growing surface and source material directly during growth allowing, for example, optical pyrometry or spectrometric measurements as a diagnostic for the growth process.
3. The layout provides for in-situ measurement of the vapour pressures of the source elements by means of optical absorption measurements made through the crossmember on either side of the flow restrictor. If the flow properties of the flow restrictor are known, then these measurements also allow the mass transport rate to be determined directly during growth.
4. The glassware relatively simple and robust and may, in principle, be extended to the growth of multinary compounds by the addition of source tubes connected to the growth tube by suitable flow restrictors (designed to minimise reverse flow of species and hence contamination of the source materials by operating at a sufficiently high flow rate). Similarly more than one crystal may be grown simultaneously by the addition of multiple growth tubes.

Figure 6:
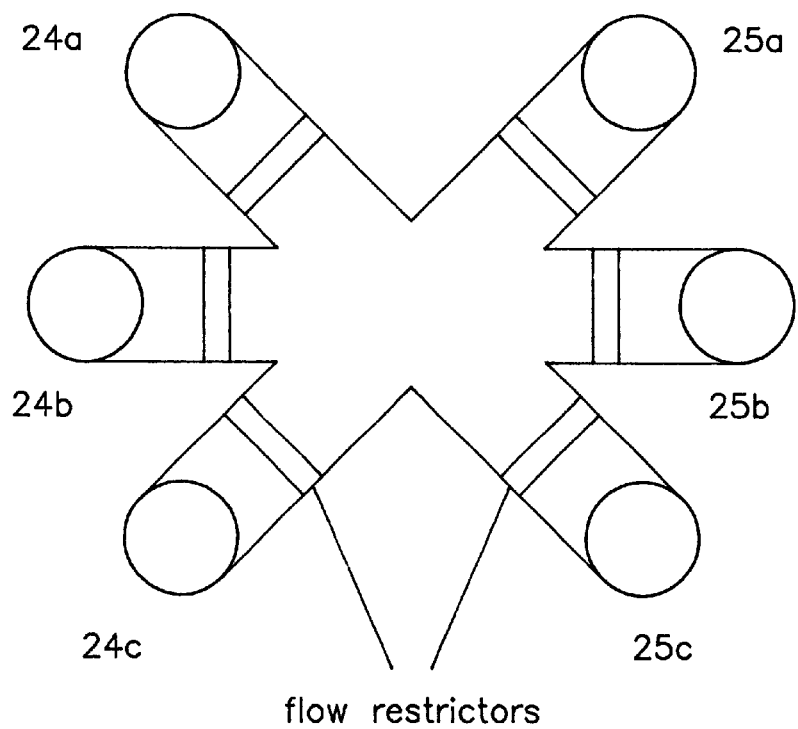
Figure 6:
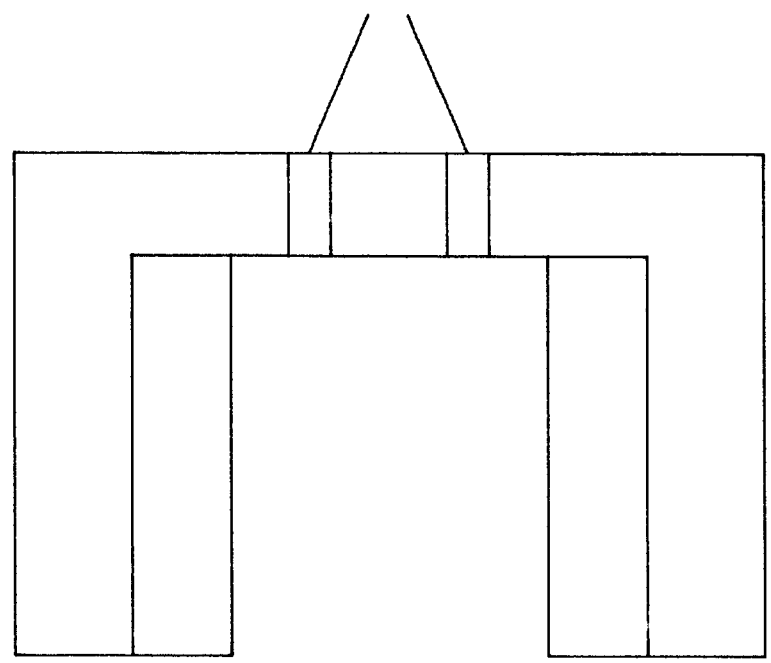

In FIG. 6 is shown an alternative arrangement comprising a plurality of source tubes having source zones (24a–c) mutually or independently associated with a growth tube having growth zone (25a–c). The apparatus is for example suited for growth of ternary or multinary compounds employing three different source materials, or for growth of a plurality of crystals of binary compounds employing alternative sources. In FIG. 6(a) is shown the apparatus in elevation.

Figure 7A:
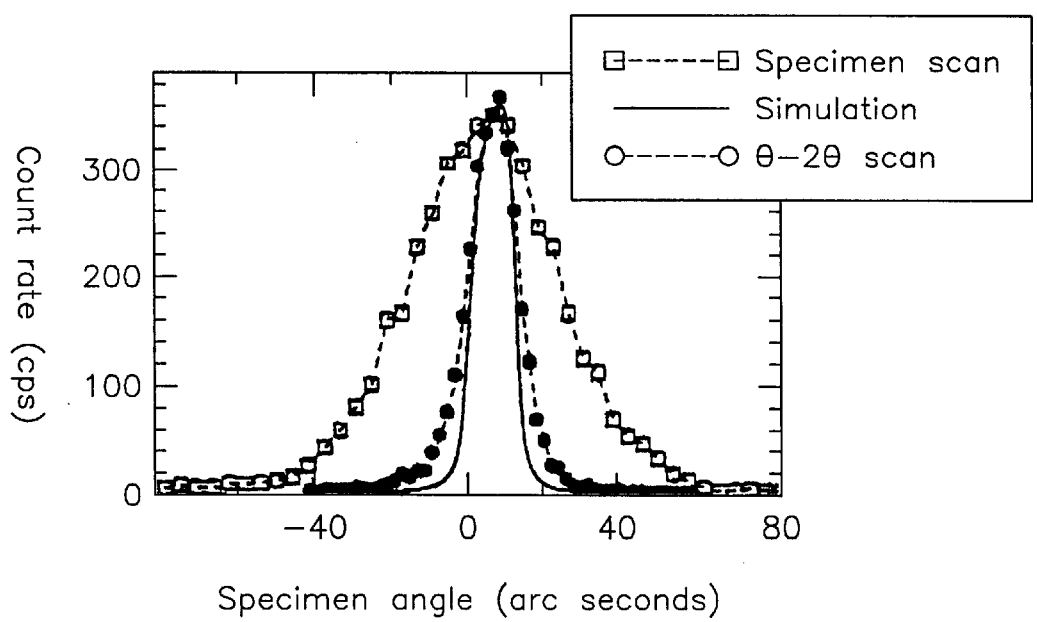
FIGS. 7a to 9 are illustrative of the crystal grown by the invention.
Figure 7B:
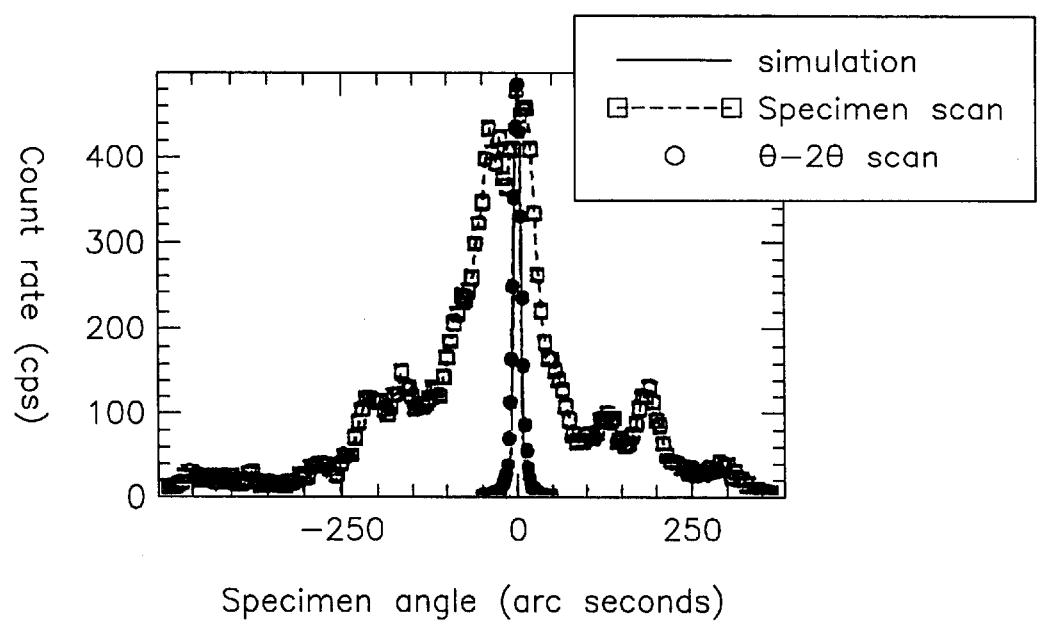
Figure 8A:
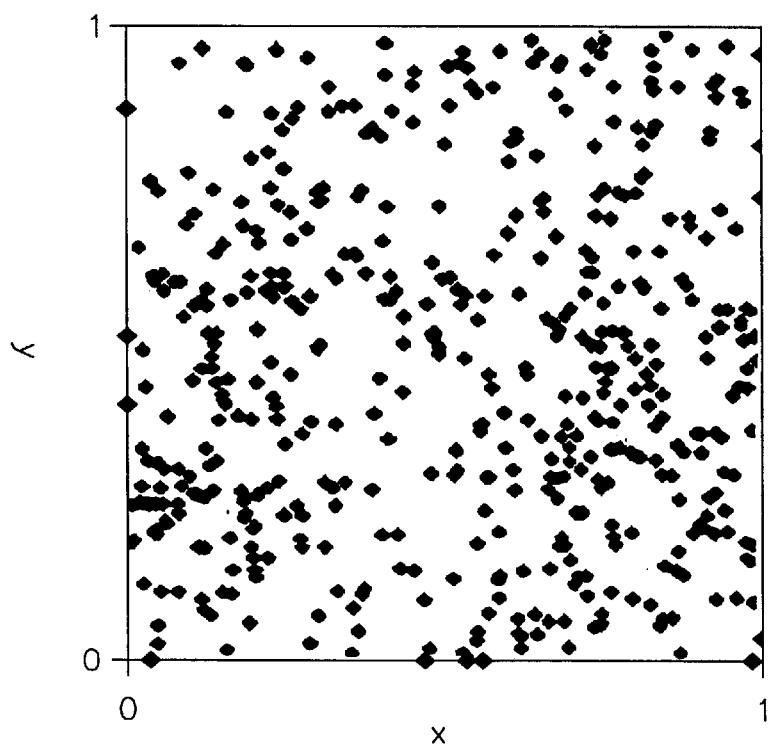
Figure 8B:
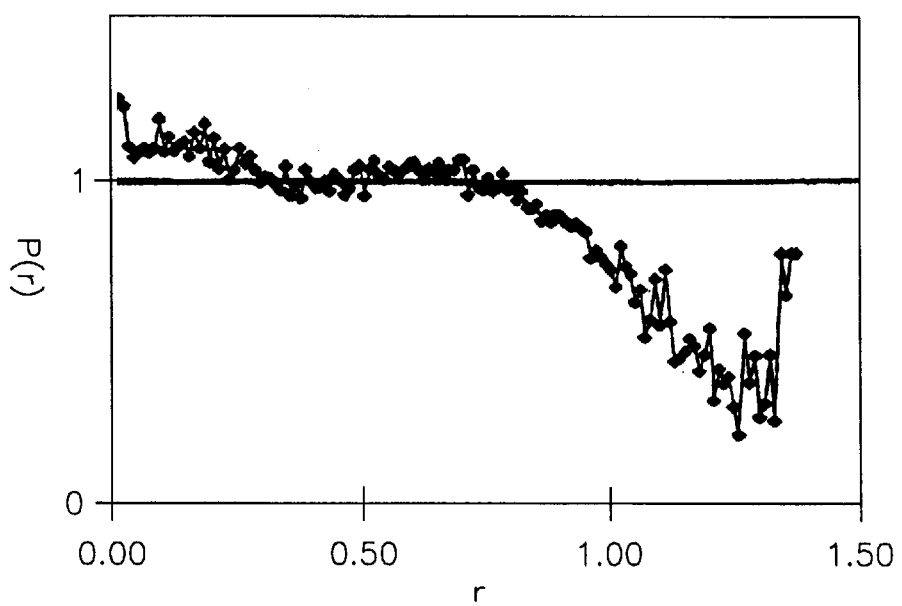
Figure 9A:
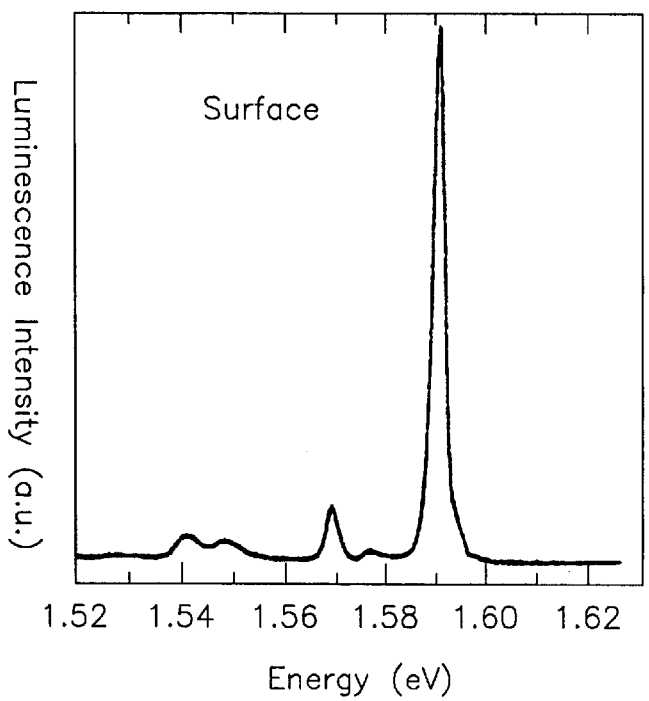
Figure 9B:
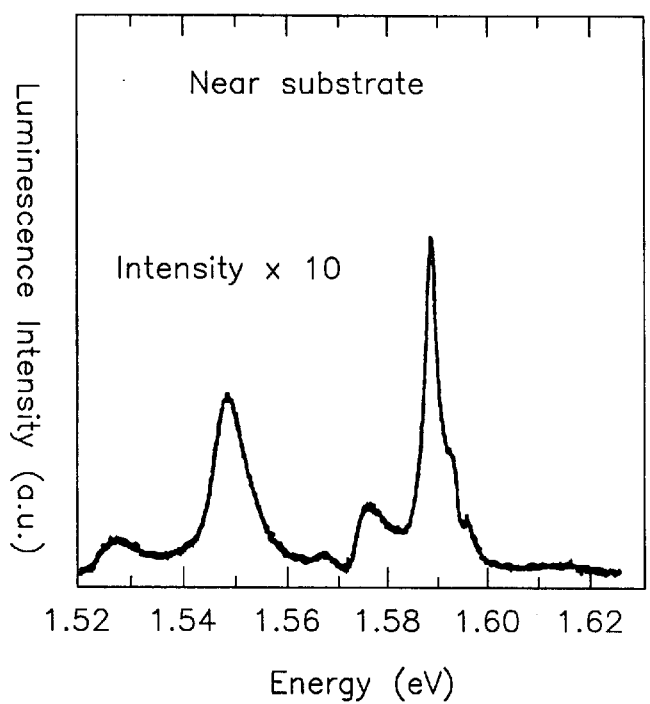

The invention is now illustrated in non limiting manner with reference to the examples and FIGS. 7–9.

EXAMPLE 1

Apparatus

"Multi-tube" vapour growth apparatus described above for FIG. 5 was developed which separates source and growth regions of the dynamically pumped growth envelope into two independent, vertical three zone furnaces connected by a horizontal optically heated crossmember which incorporates a calibrated flow restrictor to regulate the diffusionless mass transport (as proposed in J. R. Abernathey, et al, J. Crystal Growth 47 (1979) 145, F. Rosenberger, et al, technical memorandum 103786, NASA (unpublished)). Growth takes place on a seed wafer supported by a pedestal which also forms a second flow restrictor between the growth envelope and the vacuum system as in the Markov arrangement (E. V. Markov et al, Inorg. Mater. (USA) 11 (1975) 1504). Use of this arrangement isolates the source and sink thermally, makes transport relatively insensitive to the source/sink temperature difference, facilitates in-situ vapour pressure measurement (J. Carles, J. T. Mullins, and A. W. Brinkman, J. Crystal Growth 174 (1997) 740) and hence mass transport measurements and allows non-invasive optical access to the growing crystal.

The structural properties of a boule of cadmium telluride grown by this technique at 700° C. were profiled through the crystal in the growth direction by X-ray diffraction, defect revealing etching and photoluminescence (PL).

EXAMPLE 2

Crystal Growth

Growth was performed on a 49 mm diameter $Cd_{0.96}Zn_{0.04}Te$ seed wafer the greater portion of which comprised a $\{\bar{1}\,\bar{1}\,\bar{1}\}$ B oriented grain and which had been polished by a damage free bromine/methanol/ethanediol hydroplaning technique. After idling all heaters at 200° C. for two days to remove water from the system, growth was commenced by ramping the source and seed temperatures. After 10.4 hours the seed had reached its final growth temperature of 700° C. corresponding to a loss to the growth tube tail of 0.2 $gh^{-1}$ while the transport rate from the source side had reached 1.5 $gh^{-1}$ giving a growth rate of 118 $\mu mh^{-1}$; This transport rate was maintained for 12.5 hours after which it was increased to 2.5 $gh^{-1}$ yielding a growth rate of 208 $\mu mh^{-1}$ for a further 24 hours followed by ramping down at a maximum rate of 30 $Kh^{-1}$. The ramping was designed to ensure that the source flow was always greater than the growth tail loss. Flow modelling of this system has indicated that the ratio of cadmium (Cd) to tellurium ($Te_2$) pressures was 1.33 over the growing crystal. Using the data of Greenberg et al (J. H. Greenberg, V. N. Guskov, V. B. Lazarev, and O. V Shebershneva, J. Solid State Chemistry 102 (1993) 382) it is possible to estimate that this corresponds to an excess of $2 \times 10^{-6}$ at. % Te.

EXAMPLE 3

Sample Preparation and Analysis

After growth, the main $\{\bar{1}\,\bar{1}\,\bar{1}\}$ B oriented grain was cut into both horizontal and vertical slices which were then hydroplane polished apart from the uppermost horizontal slice for which the as-grown surface was assessed. A Bede D3 Triple axis X-ray diffractometer employing $CuK_\alpha$ radiation from a sealed tube was used to obtain rocking curves and $\theta$–$2\theta$ scans from the surfaces of horizontal slices. One vertical slice was etched using $FeCl_3$ (as described by Watson et al, Mater. Sci. Eng. B16 (1993) 113) to reveal etch pits which were recorded photographically prior to having their positions digitised for determination of the randomness of their distribution (as described by Rose et al, J. Phys. D: Appl. Phys. 31 (1998) 1008). Photoluminescence spectra were obtained at 10 K using the 457.9 nm line of an Argon ion laser and a power density of 10 mW $cm^{-2}$.

FIG. 1 shows triple axis rocking curves and $\theta$–$2\theta$ scans taken, respectively, directly from the top (as grown) surface of the boule, 6.9 mm above the seed surface and (b) 0.8 mm above the seed wafer. The solid curves show theoretical $\theta$–$2\theta$ profiles calculated using dynamical diffraction theory and assuming completely unstrained cadmium telluride. Broadening of the $\theta$–$2\theta$ scans is only 2 arc seconds corresponding to strains in the region of $10^{-5}$. On the other hand, the rocking curves exhibit substantial broadening attributable to a mosaic structure of essentially unstrained sub-grains. Considerable reduction in the fall width half maximum values of these spectra, from 107" near the seed to 43" at the top surface, is apparent.

Etch pit studies showed that the dislocation density generally decreased in the direction of advancing growth. There was also some lateral variation but this was not systematic. The average dislocation density in the upper portion of the boule was $6 \times 10^4$ $cm^{-2}$ with values in the range $3$–$9 \times 10^4$ $cm^{-2}$ being measured. FIG. 2(a) shows a representative distribution of etch pits from a square of side 913 $\mu$m. FIG. 2(b) shows normalised radial dislocation density (correlation function), P(r), plot for the data of (a). FIG. 2(a) is oriented so that the positive y direction corresponds to the direction of growth. 'Sub-grains' or 'polygonisation walls' are common in CdTe and are characterised by rows of closely spaced dislocations. CdTe is also prone to have a non-uniform distributions of dislocation density (clustering) on the scale of 500 $\mu$m. These effects can be distinguished quantitatively by using a radial density distribution (correlation) function, P(r). To compute P(r), for a distribution of points in a unit square, a frequency chart is first constructed. For all radii, r, the frequency with which dislocations within radii r and r+$\delta$r of one another is recorded. This data is normalised by dividing by the frequency curve for a computer generated random distribution. The resulting curve is P(r) and for a truly random distribution P(r)=1 for $0 < r < \sqrt{2}$. Values of P(r)>1 indicate an enhanced probability of associations at radius r. Therefore in FIG. 2(b) the peak near r=0.05 indicates that there are lines of dislocations with this spacing, i.e. sub-grain boundaries.

Deviations from P(r)=1 at other radii indicate longer range effects. Notably the decline in P(r) for r>0.75 indicates areas of non-uniformity at those radii on the unit square, i.e. there is dislocation clustering in these samples. Etch pitting also confirmed the general trend of reducing dislocation density in the growth direction as shown by the X-ray data.

FIG. 3(a) and (b) respectively show photoluminescence spectra taken near the upper surface and close to the seed. In both cases, the dominant peak is due to acceptor bound exciton recombination at 1.59 eV (as is typically observed in bulk CdTe, B. Yang et al, J. Crystal Growth 159 (1996) 171). It can be seen that the intensity of this emission increases in both absolute terms and relative to the donor-acceptor pair emission at 1.54–1.55 eV with increasing distance from the seed again indicating an improvement in crystalline quality. The fall width half maximum varies from 4 meV (near seed) to 2.1 meV (top of boule) through the crystal. No donor—A centre (metal vacancy complex) related acceptor pair emission (J. W. Allen, J. Crystal Growth 10 (1995) 1049) was observed around 1.4 eV. The donor bound exciton emission appears as a shoulder on the high energy side of the main peak and there is evidence for free exciton emission at 1.596 eV. Phonon replicas of the acceptor bound and free exciton transitions are also present, down-shifted by 21 meV.

CONCLUSION

The structural properties of a boule of cadmium telluride grown on a $Cd_{0.96} Zn_{0.04}$ Te seed at 700° C. by a novel 'Multi-tube' vapour growth technique have been characterised. As typically found in CdTe (K. Durose et al, J. Crystal Growth 86 (1988) 471), dislocations were observed to polygonise into a mosaic of sub-grains, possibly propagating from the seed. Considerable improvement in quality, as evidenced by a reduction in X-ray and photoluminescence linewidths and etch pit densities was observed with increasing distance from the seed indicating a tendency for these defects to grow out. It may be that this process was assisted by the relatively high strength of the material at this low growth temperature. Photoluminescence measurements exhibited a dominant acceptor bound exciton emission. As the material was grown under conditions of a slight tellurium excess, it is possible that cadmium vacancies are responsible for this (B Yang et al above referred).

The relatively low growth temperature was expected to improve the structural quality of the material as the critical shear stress increases with decreasing temperature (R. Balasubramanian et al, Mater. Sci. Eng. B16 (1993) 1). Additionally, the tendency for the growth of non-stoichiometric material is less at lower temperatures due to the narrower existence region of a single phase of non-stoichiometric CdTe and the larger pressure ratios required to saturate the material with one constituent (N. Yellin et al, J. Crystal Growth 73 (1985) 77, Greenberg et al above referred).

What is claimed is:

1. Apparatus for bulk vapour phase crystal growth comprising:
   a) at least one source zone and at least one sink zone, each associated with means for independent temperature control within the zone;
   b) at least one passage means for transport of vapour from source to sink zone, said passage means deviating by an angle of from 30° to 180° along the length thereof between said source and sink zones for isolating thermal radiation between said source and sink zones; and;
   c) means for in-situ monitoring of the sink zone which is non-intrusive in terms of temperature regulation within the sink zone.

2. Apparatus according to claim 1 comprising:
   a plurality of source zones and a single sink zone, each associated with means for independent temperature control within the zone; and
   a plurality of passage means adapted for transport of vapour from respective sources to the sink zone.

3. Apparatus according to claim 1 wherein:
   the means for independent temperature control are for establishing a temperature differential to enable solid-vapour-solid phase transition in the respective source, transport and sink zones employing in each case a greater source than sink temperature with use of appropriate cooling and/or heating control.

4. Apparatus according to claim 1 wherein:
   the means for in-situ monitoring comprises means providing visual and/or radiation access to the sink zone but located remote therefrom.

5. Apparatus according to claim 4 having means for direct monitoring of crystal growth which comprises at least one passage for monitoring communication between the remote visual/radiation access means and the sink zone, wherein the at least one passage for monitoring communication and the at least one passage for transport of vapour associated with any given sink zone are coincident for at least that portion of their length proximal to the sink zone.

6. Apparatus according to claim 5 wherein the means for direct monitoring of crystal growth are located external to the passages as hereinbefore defined, by means of the visual/radiation access means.

7. Apparatus according to claim 5 wherein the passage for visual/radial communication associated with any given sink zone deviates by an angle between 30° and 180° at any one or more points along the length thereof remote from the sink zone.

8. Apparatus according to claim 1 wherein means for visual/radiation access is located in the wall of the passage for vapour transport in direct line communication with the sink zone.

9. Apparatus according to claim 5 wherein the passage for visual/radiation monitoring deviates by an angle as hereinbefore defined from a direct line communication of source and sink zone, and means for visual/radiation reflection is provided in association with the passage for visual/radiation monitoring at its point of deviation, whereby virtual or reflected direct line access is provided with the sink zone.

10. Apparatus according to claim 1 which additionally comprises a flow restrictor, located remote from and between source and sink zones, for the purpose of vapour pressure control.

11. Apparatus according to claim 1 which comprises one or more reservoirs adapted to comprise source material and a crystal of seed material supported on a surface or pedestal adapted to the processing conditions to be employed, allowing convenient and efficient vaporisation.

12. Process for bulk vapour phase crystal growth comprising:
   providing at least one reservoir of source material and at least one sink or seed crystal, each associated with independent temperature control means; and
   transporting vapour phase material between source and sink or seed along a transport path that deviates by an angle of from 30° to 180° between the source and sink seed to preclude thermal radiation from passing therebetween; and
   providing in-situ means for monitoring growth of crystal at each sink or seed which is substantially non-intrusive in terms of temperature conditions at the sink or seed.

13. A process according to claim 12 comprising:
   providing a plurality of reservoirs of same or different elemental or compound source material(s) and a single sink or seed crystal, each associated with independent temperature control means.

14. A process according to claim 12 wherein means for monitoring radiation and transport for any given sink or seed is by coincident monitoring and transport path for at least the portion of the respective paths proximal to the sink or seed, as hereinbefore defined.

15. A process according to claim 12 comprising, in a preliminary stage, establishing a sufficient vapour pressure above source material to initiate transport and establish transport control and temperature control in the sink zone for controlled growth at the sink seed.

16. A process according to claim 12 which comprises controlling the process by direct reading of process variables, comparison with optimum values of process variables for a desired crystal growth, with use of a process model, and on line optimisation thereof.

17. A method which comprises bulk vapour phase crystal growth in apparatus according to claim 1.

18. A method according to claim 17 for semiconductor or optical crystal growth from polycrystalline binary, ternary or other multinary compound.

19. A method according to claim 17 wherein the crystal is that of a compound of an element of one of groups IIA, IIB, III, IV, V, VI and VII of the Periodic Table of Elements.

20. A crystal which is the same as that grown with apparatus according to claim 1 and having structural properties of increased critical shear stress with decreasing temperature and uniform stoichiometry in crystals grown at low or high temperature.

21. A crystal which is the same as that grown according to the method of claim 2 and having structural properties of increased critical shear stress with decreasing temperature and uniform stoichiometry in crystals grown at low or high temperature.

* * * * *